United States Patent [19]

Green

[11] Patent Number: 5,345,192

[45] Date of Patent: Sep. 6, 1994

[54] VOLTAGE CONTROLLED INTEGRATED CIRCUIT FOR BIASING AN RF DEVICE

[75] Inventor: Ronald P. Green, Carlsbad, Calif.

[73] Assignee: SGS-Thomson Microelectronics, Inc., Carrollton, Tex.

[21] Appl. No.: 11,392

[22] Filed: Jan. 29, 1993

[51] Int. Cl.$^5$ .............................................. H03F 1/30
[52] U.S. Cl. ..................................... 330/289; 307/310
[58] Field of Search ............... 330/296, 256, 261, 289; 307/310, 491

[56] References Cited

U.S. PATENT DOCUMENTS

| | | | |
|---|---|---|---|
| 3,781,699 | 12/1973 | Sakamoto | 330/261 |
| 4,042,886 | 8/1977 | Hanna | 330/290 |
| 4,591,743 | 5/1986 | Kung | 330/289 |
| 4,602,208 | 7/1986 | Hines | 330/289 |

FOREIGN PATENT DOCUMENTS 219223  9/1988  Japan .................................. 307/491

OTHER PUBLICATIONS

Electronics/ Mar. 3, 1977 Self-Stabilizing Op Amp Has Low Temperature Coefficients p. 116 By Joseph M. Gorin.

Primary Examiner—Steven Mottola
Assistant Examiner—Tiep Nguyen
Attorney, Agent, or Firm—Renee Michelle Larson; Lisa K. Jorgenson; Richard K. Robinson

[57] ABSTRACT

The present invention is directed to a voltage controlled single-package integrated circuit device, capable of thermal compensation, for biasing a quasi-linear bipolar device. The bias circuit also provides a low impedance source to a RF device so that the bias point does not dynamically change with the RF signal, thus improving linearity. Changes in the base-emitter voltage level of the RF device are monitored by a reference diode to provide automatic temperature compensation. The reference diode is in close thermal proximity to the RF device, allowing for accurate thermal tracking. The base-emitter voltage may be electronically adjusted by means of a control voltage input, such being suitable for hook-up to a computer system having a digital to analog convertor thereby allowing for fine voltage adjustments. The control voltage may also be used to adjust the class of operation of the RF device or provide external temperature control.

11 Claims, 1 Drawing Sheet

VOLTAGE CONTROLLED INTEGRATED CIRCUIT FOR BIASING AN RF DEVICE

CROSS REFERENCE TO RELATED APPLICATIONS

The subject matter of the present application is related to co-pending U.S. application, Ser. No. 07/932,755, titled "Device for Biasing an RF Device Operating in Quasi-Linear Modes with Temperature Compensation", filed on Aug. 20, 1992 and assigned to the assignee hereof, and herein incorporated by reference.

BACKGROUND OF THE INVENTION

1. Field of the Invention

The present invention relates generally to an integrated circuit for biasing a quasi-linear bipolar device, and more specifically to a voltage controlled single-package integrated circuit device capable of thermal compensation for biasing such a device.

2. Description of the Prior Art

It is well-known in the art that biasing circuitry is required for quasi-linear devices such as bipolar RF transistors. Quasi-linear devices are characterized as being in the common-emitter configuration with a conduction angle of 180 degrees to 360 degrees. The biasing circuitry must supply the proper current levels required by the device while compensating for drifts in the device operating point brought about by changes in ambient temperature and operating conditions. Systems which are not protected from temperature fluctuations are more susceptible to ambient temperature changes and system heat-sinking properties which are not optimal. If operating point drift is not addressed and remedied, catastrophic device failure, or "thermal runaway" may result.

Because of this potential danger caused by thermal variations, biasing circuitry has long monitored and compensated for fluctuations in temperature. Typically, the base-emitter voltage level of the RF device being biased is monitored and, when increases in temperature cause the voltage level to drop, the voltage is stabilized by decreasing the amount of current in the RF circuit. However, biasing circuitry of the prior art has usually included multiple active components, capacitors, and inductors, on a PCB. Since these components are usually fabricated by different suppliers, the RF characteristics of the active devices typically have different geometries and, thus, often do not exactly match the characteristics of the RF device being biased. In addition, the use of discrete components utilizes more valuable board space than would a biasing circuit on a single integrated circuit. This is very important in today's market of high performance, low cost, small RF power hybrid modules.

Besides thermal tracking of the biased device, another important concern is the ability to change class of operation as system demands dictate. Typical quasi-linear modes of operation include classes A, AB1, AB2, and B. It may be desirable to change a system's mode of operation to any one of these. For example, if more efficiency and less linearity of operation is required, it may make sense to change class of operation from class AB1 to AB2. The class of operation of an RF device is typically altered by varying the voltage supplied to the device. However, the prior art has not successfully addressed this need with a single-package integrated circuit device.

SUMMARY OF THE INVENTION

It is therefore an object of this invention to utilize biasing circuitry which monitors and compensates for changes in the operating point of a quasi-linear device caused by fluctuations in temperature or operating point.

It is further an object of this invention to utilize biasing circuitry capable of changing the class of operation of a quasi-linear device.

The present invention is directed to a voltage controlled single-package integrated circuit device, capable of thermal compensation, for biasing a quasi-linear bipolar device. The bias circuit also provides a low impedance source to a RF device so that the bias point does not dynamically change with the RF signal, thus improving linearity. Changes in the base-emitter voltage level of the RF device are monitored by a reference diode to provide automatic temperature compensation. The reference diode is in close thermal proximity to the RF device, allowing for accurate thermal tracking. The base-emitter voltage may be electronically adjusted by means of a control voltage input, such being suitable for hook-up to a computer system having a digital to analog convertor thereby allowing for fine voltage adjustments. The control voltage may also be used to adjust the class of operation of the RF device or provide external temperature control.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
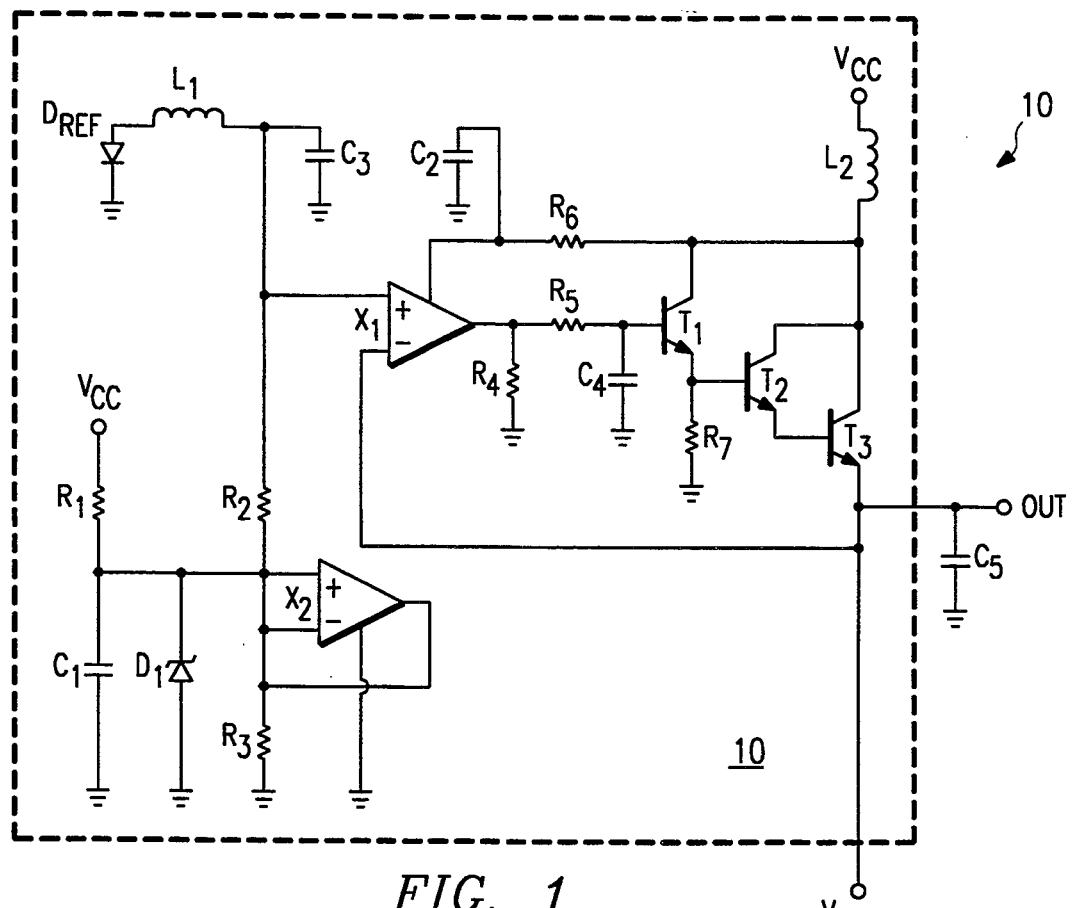
FIG. 1 is a schematic of a biasing circuit for an RF device according to the prior art.

FIG. 1 shows a schematic of a biasing circuit 10 for an RF device according to the prior art. Comprised of discrete components, both passive and active, biasing circuit 10, as indicated by the dashed lines, is contained on a PCB and therefore does not reside in a single-package integrated circuit device. Reference diode $D_{REF}$, which is thermally coupled to the RF device, monitors the base-emitter voltage with respect to ambient temperature changes of the RF transistor being biased. An increase of 1 degree Celsius, yields a PN junction voltage decrease of 2 to 2.5 millivolts. As the ambient temperature increases, the PN junction voltage drops, causing the operating point of the device to drift. If this phenomenon is not stabilized, thermal runaway may be the result. When a base-emitter voltage drop is detected via temperature by reference diode $D_{REF}$, bias circuitry 10 compensates by supplying less voltage to the RF device. This compensation is accomplished by discrete components capacitor $C_1$, zener diode $D_1$, resistor $R_3$, comparator $X_2$, and reference diode $D_{REF}$. $V_{CNTL}$ is a voltage input to bias circuit 10, whereby the voltage supplied to the RF device may be controlled. OUT is the voltage signal to be fed to the base of the biased RF device.

Many different biasing circuits could be used to accomplish what is shown in FIG. 1. However, it is important to recognize that this prior art is not a single package integrated circuit solution. Because the biasing circuit 10 is comprised of discrete components, both passive and active, board space is used and mismatch of RF characteristics between these discrete components and the RF device being biased is experienced.

Figure 2:
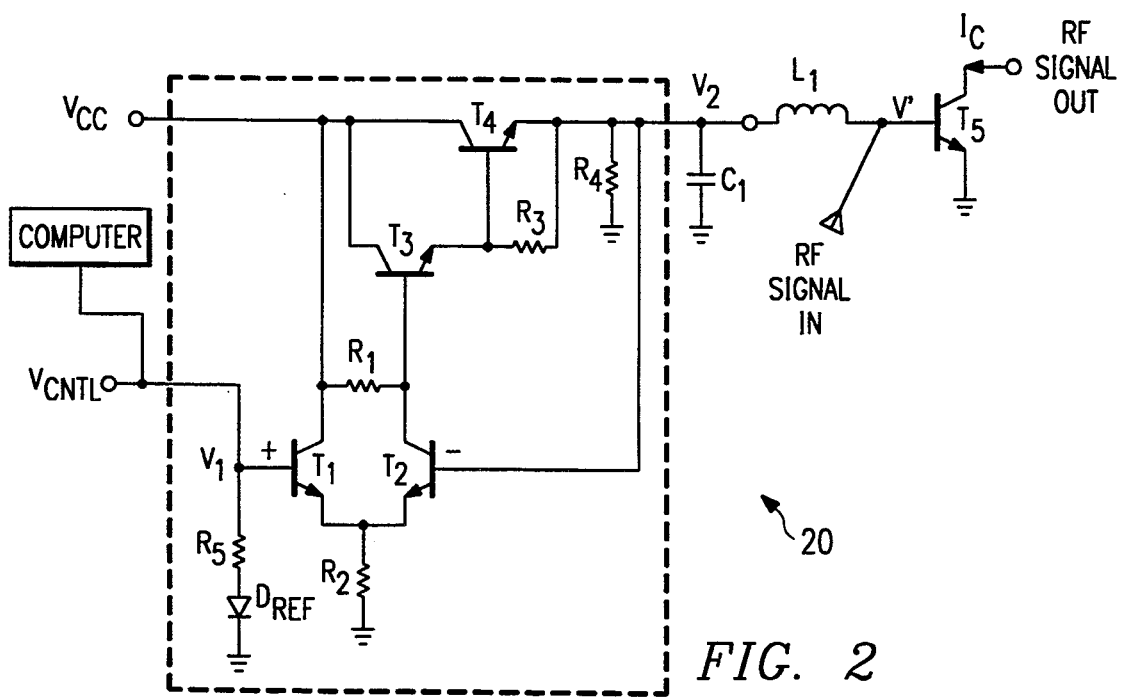
FIG. 2 is a schematic of a biasing circuit for an RF device according to the present invention.

Referring now to FIG. 2, a schematic of a biasing circuit 20 for an RF device according to the present invention is shown. The components of biasing circuit 20, contained within the dashed lines, are contained in a single-package integrated circuit. Active components $L_1$ and $C_1$ provide RF decoupling to bias circuit 20. $V_{CC}$, the supply voltage, is a standard supply voltage similar to that used by many bipolar RF devices today.

$D_{REF}$, the reference diode, is placed in close thermal proximity to the RF device being tested—in this case, $T_5$—and monitors the junction temperature of $T_5$ and thus the drift in the base-emitter voltage of $T_5$ with respect to ambient temperature changes. Since reference diode $D_{REF}$ is thermally connected to biased device $T_5$, biasing circuit 20 will track $T_5$'s base voltage in response to temperature changes in $T_5$, and maintain a constant quiescent collector current. Thus, class of operation and performance are maintained. For maximum thermal tracking, it is important that reference diode $D_{REF}$ be placed in thermal proximity to biased device $T_5$. Since biasing circuit 20 is a single integrated circuit, close placement of $D_{REF}$ to $T_5$ is facilitated.

As biased device $T_5$ heats up, reference diode $D_{REF}$ senses this temperature change and bias circuit 20 adjusts the voltage value at voltage $V_1$ accordingly. A change in voltage $V_1$ is mirrored by a corresponding change in base-emitter voltage $V'$ such that the collector current of the biased device $I_C$ remains constant. It will be understood by those familiar with the art, that the value of resistor $R_5$ is relatively small and is chosen to establish $V_{CNTL}$ at $V_1$ while allowing any decrease in the value of the PN junction voltage of $T_5$ to also be reflected at $V_1$.

The feedback loop which adjusts base-emitter voltage $V_1$ in response to changes in temperature is composed of differential pair $T_1$ and $T_2$ and Darlington pair $T_3$ and $T_4$. $T_1$ and $T_2$, with their emitters decoupled from ground via small resistor $R_2$, form a differential pair. It is advantageous for differential pair $T_1$ and $T_2$ to have closely matched characteristics so that they are balanced. When transistors $T_1$ and $T_2$ are made from the same die, as is the case here, matching is facilitated. Since $V_2$ is usually a constant value, $R_2$ represents a constant current source. Current which flows through $R_2$ is shared by $T_1$ and $T_2$. If $V_{CNTL}$ is increased, $T_1$ turns on more, thereby providing less current to $T_2$ and more current for Darlington Pair $T_3$ and $T_4$, causing $V_2$ to increase.

Darlington pair $T_3$ and $T_4$ provide bias circuit 20 with a low impedance current source as required by ideal voltage source $V'$, and therefore serves to pass through current needed to maintain emitter-base voltage $V'$ at a stable level independent of the current needs of biased device $T_5$. Darlington pair $T_3$ and $T_4$ are especially attractive because of the extra current gain they offer. They provide increased sensitivity for a more stable output voltage and a lower output impedance than would otherwise be achieved. Resistor $R_4$ is used to provide a current sink option for bleeding excess charge; in this way, bias circuit 20 can both source and sink current thereby eliminating the need to rely on $T_5$ to sink current.

The physical size of Darlington transistors $T_3$ and $T_4$ can be increased so that they are capable of passing more current. If this increase in size is implemented, differential pair $T_1$ and $T_2$ may also need to be larger in order to withstand the larger current which will flow through $R_1$. And, while $T_3$ and $T_4$ offer excellent current gain characteristics, they could be replaced by other circuitry, such as a single-pass transistor, if less current gain is acceptable.

The presence of transistor $T_1$ allows emitter-base voltage $V'$ to be electronically controlled. Control voltage input $V_{CNTL}$ provides the means by which the user may adjust $V'$ as required. Changing $V_{CNTL}$ also allows the class of operation of the biased device to be changed. For instance, hooking up control voltage input $V_{CNTL}$ to a computer which possesses a digital to analog convertor would allow frequent and minute adjustments to be made to $V_{CNTL}$, thereby changing the voltage at the base of $T_1$ and, in turn, the value of base-emitter voltage $V'$.

As described above, when base-emitter voltage $V'$ is changed, the collector current $I_C$ of biased device $T_5$ also changes, allowing its class of operation to be changed. Biased device $T_5$ may be operating in the Class AB1 mode if a linear range of operation is desired. Changing the value of $V_{CNTL}$ can push biased device $T_5$ into a Class AB2 mode of operation which may be desirable if greater efficiency and a smaller linear range of operation is required. Changing the class of operation of biased device $T_5$ is accomplished by simply varying the voltage level of $V_{CNTL}$ and does not require changing any components in biasing circuit 20. This advantage differentiates the invention over the prior art.

An improved structure for biasing devices has been described. Any bipolar device operating in the quasi-linear mode where thermal runaway is an issue and where it might be advantageous to change the class of operation during operation stands to benefit from the invention described herein.

While the invention has been particularly shown and described with reference to a preferred embodiment, it will be understood by those skilled in the art that various changes in form and detail may be made therein without departing from the spirit and scope of the invention. For instance, reference diode $D_{REF}$ is described as the means by which the junction temperature of biased device T5 is monitored. However, one skilled in the art will understand that other semiconductor temperature sensing devices, such as a transistor, may be used. Additionally, an active current source, rather than resistor $R_2$, could be used to decouple the emitters of differential pair $T_1$ and $T_2$ to ground.

What is claimed is:

1. A single package integrated circuit device for biasing a quasi-linear bipolar device having a class of operation, comprising:

a reference device for monitoring temperature changes of the quasi-linear bipolar device and for monitoring any corresponding deviations of a base-emitter voltage of the quasi-linear bipolar device from a predetermined base-emitter voltage level;

a feedback loop for maintaining the predetermined base-emitter voltage level of the quasi-linear bipolar device comprising a differential transistor pair, having a first transistor and a second transistor wherein a emitter of the first transistor and an emitter of the second transistor are connected, and a Darlington transistor pair, having a third transistor and a fourth transistor, with a base of the third transistor connected to a collector of the second transistor, a base of the fourth transistor connected to an emitter of the third transistor, and a collector of the third transistor connected to a collector of the fourth transistor, wherein the Darlington transistor pair provide a low impedance current source required to maintain the predetermined base-emitter voltage level of the quasi-linear bipolar device; a voltage control input, for selectively electronically adjusting the predetermined base-emitter voltage level of the quasi-linear bipolar device thus changing the class of operation of the quasi-linear bipolar device, connected to a base of the first transistor.

2. The biasing device of claim 1, wherein the voltage control input is suitable for control by a computer such that frequent and small changes in the predetermined base-emitter voltage level may be realized.

3. The biasing device of claim 1, wherein the class of operation refers to classes A, AB1, AB2, and B.

4. The biasing device of claim 1, wherein the reference device is in close thermal proximity to the quasi-linear bipolar device.

5. The biasing device of claim 4, wherein the reference device is a diode.

6. The biasing device of claim 1, wherein the emitter of the first transistor and the emitter of the second transistor are decoupled from ground through a small resistance.

7. The biasing device of claim 6, wherein the small resistance is a resistor having a current, wherein the resistor behaves as a constant current source and the current through the resistor is shared between the first transistor and the second transistor.

8. The biasing device of claim 1, wherein the collector of the third transistor and the collector of the fourth transistor are connected to a power supply.

9. The biasing device of claim 1, wherein a resistive element supplies current from a power supply to the base of the third transistor.

10. The biasing device of claim 9, wherein the resistive element is a resistor.

11. The biasing device of claim 1, wherein the quasi-linear bipolar device is a bipolar RF transistor.

* * * * *